United States Patent [19]

Sclar

[11] Patent Number: 4,547,792
[45] Date of Patent: Oct. 15, 1985

[54] SELECTIVE ACCESS ARRAY INTEGRATED CIRCUIT

[75] Inventor: Nathan Sclar, Diamond Bar, Calif.

[73] Assignee: Rockwell International Corporation, El Segundo, Calif.

[21] Appl. No.: 495,361

[22] Filed: Jul. 8, 1983

Related U.S. Application Data

[63] Continuation of Ser. No. 161,177, Jun. 19, 1980, abandoned.

[51] Int. Cl.$^4$ ............... H01L 27/10; H01L 27/14; H01L 31/00; H01L 27/02
[52] U.S. Cl. ............................. 357/45; 357/30; 357/41; 357/55
[58] Field of Search ............... 357/30, 45, 55, 41

[56] References Cited

U.S. PATENT DOCUMENTS 3,849,678  11/1974  Flynn ............................. 357/30
4,104,674  8/1978   Lorenze et al. ................. 357/55
4,238,760  12/1980  Carr .............................. 357/55

Primary Examiner—Gene M. Munson
Attorney, Agent, or Firm—H. Fredrick Hamann; Daniel R. McGlynn

[57] ABSTRACT

A semiconductor integrated circuit is described which includes an array of electronic devices and a plurality of electronic access devices. The access devices consist of sets of MOSFETs which may be turned on by the joint action of X and Y address lines to permit individual and isolated electrical connection between selected electronic devices in the array and peripheral on or off-chip sensing circuits. This permits continuous readout to be established and maintained for the selected devices without interference with the other devices in the array and without a requirement to readout any but the selected devices. One important embodiment of the present invention is one in which the electronic devices are visible or infrared radiation detectors. In order to provide minimum dead space between the array detectors, the array and access devices may be disposed on opposite surfaces of the semiconductor body.

9 Claims, 10 Drawing Figures

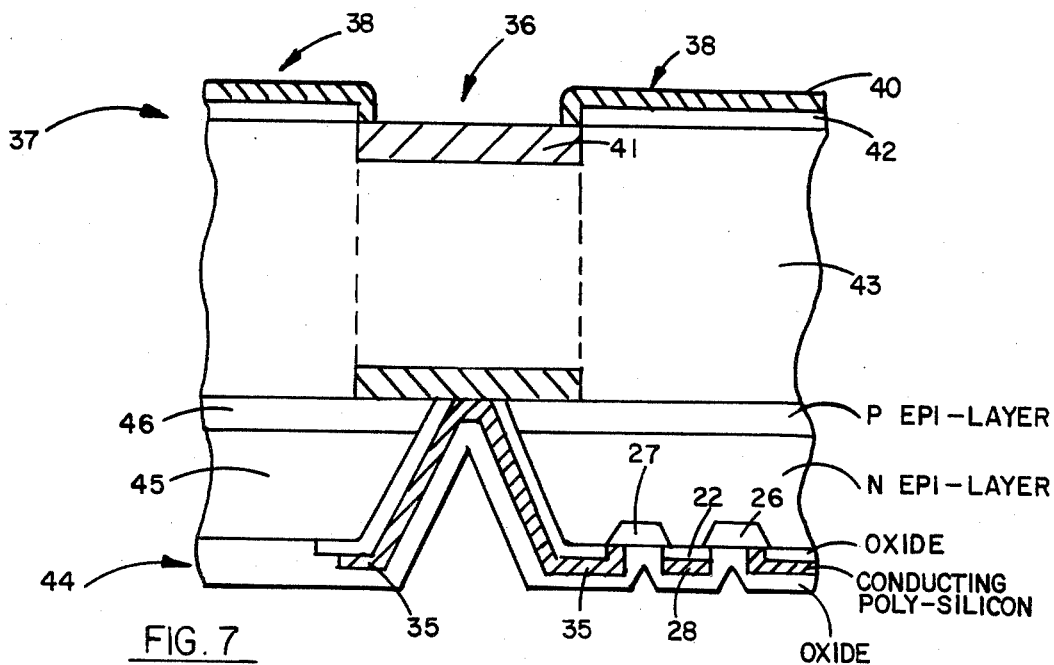
FIG. 7
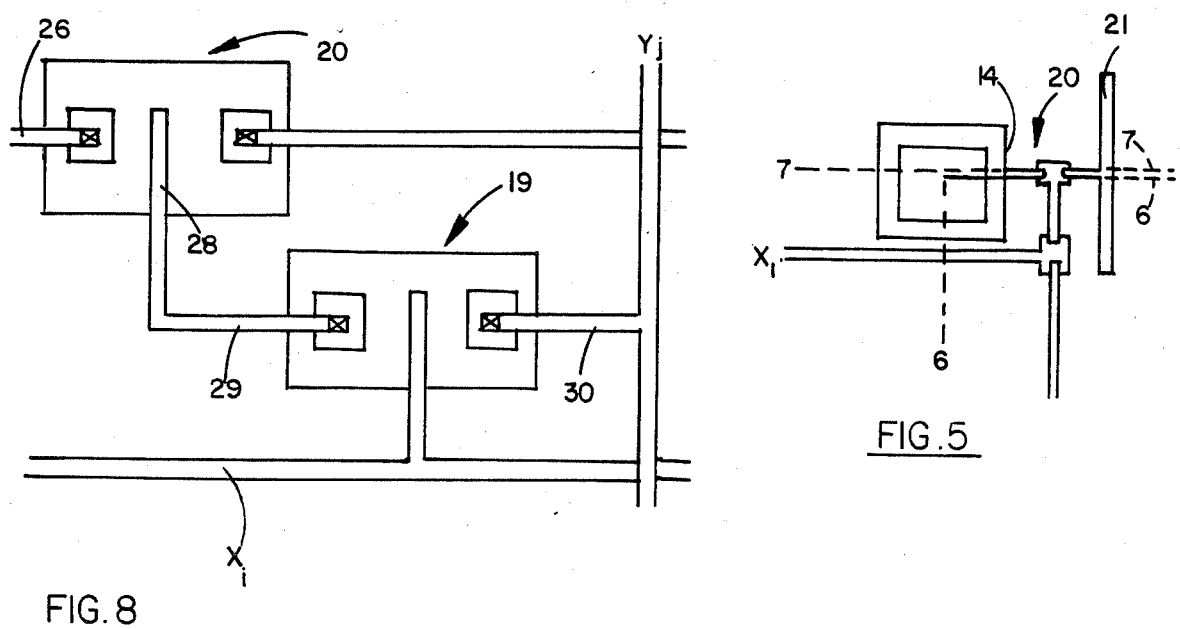
FIG. 8
FIG. 5
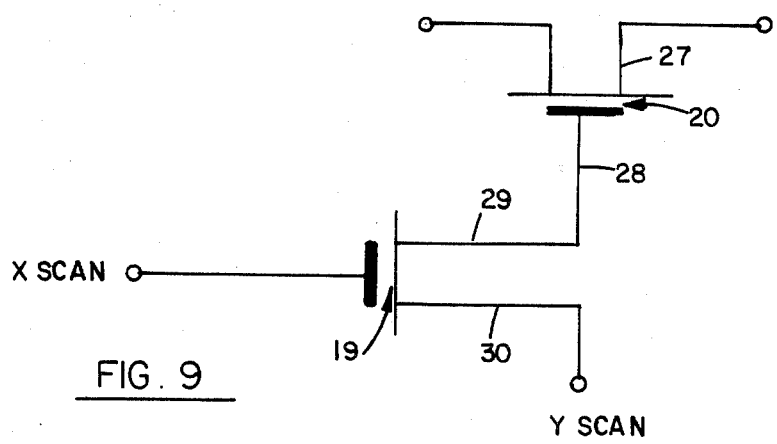
FIG. 9

4,547,792

SELECTIVE ACCESS ARRAY INTEGRATED CIRCUIT

The invention herein described was made in the course of or under a contract or subcontract thereunder, with the Army.

This application is a continuation of application Ser. No. 161,177, filed June 19, 1980, now abandoned.

TECHNICAL FIELD OF THE INVENTION

The invention relates to access circuits for electronic device arrays implemented on the surface of a semiconductor wafer, and in particular to selective access circuits which permits simultaneous and continuous readout from an arbitrarily selected arrangement of devices in the array.

BACKGROUND OF THE INVENTION

Various types of integrated circuits including an array of substantially identical electronic detector array devices on one surface of a semiconductor body, and a plurality of electronic access devices associated therewith are known in the prior art. Many of such circuits are implemented with the devices on one side of the array, and the access circuits on the other side. U.S. Pat. No. 3,849,678 discloses a photo detector array implemented on one side of a semiconductor wafer and an array of MOSFET switches on the other side of the wafer to enable scanning of the array elements. U.S. Pat. Nos. 4,142,207 and 4,143,269 disclose an imaging system including a MOS field effect transistor switching matrix and a ferroelectric detector matrix located on opposite sides of a heat sink. Other U.S. Pat. Nos. 3,593,067, and 3,101,049, and 3,604,987 and 3,617,823 and 3,689,900 and 3,735,137 and 3,792,258 disclose various semiconductor devices in which active circuit elements are implemented on both sides of the semiconductor body. In each of the cited patents, the array elements are read out sequentially through a common signal readout path.

Such detector configurations and imaging systems of the prior art are directed to particular applications which are not associated with the problem of simultaneously accessing and reading or writing from an arbitrarily arranged plurality of electronic devices in the array. Prior to the present invention, there has not been an integrated circuit which permits simultaneous access to such an arrangement of electronic devices in an array.

SUMMARY OF THE INVENTION

Briefly, and in general terms, the invention relates to selective access circuits for electronic device arrays, and more particularly to selective access circuits implemented on a common semiconductor body together with the array of electronic devices.

The present invention provides a selective access array comprising a common body of semiconductor material having a first and a second major surface, a plurality of substantially identical electronic devices implemented in a first array on the first major surface, a plurality of electronic access devices implemented in a second array on the body which provides access to the electronic devices in the first array, and access means implemented on the body to electronically sample the outputs of selected electronic devices. The access means permits the simultaneous access of an arbitrarily arranged pattern of the electronic devices in the array. Moreover, the conduction path to such devices can remain on a predetermined period of time, thereby permitting external circuits to continuously monitor selected devices.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

FIG. 5 is a plan view of one embodiment of the access circuit portion of the selective access array integrated circuit according to the present invention;

FIG. 7 is a cross-sectional view of the integrated circuit through the 7—7 line shown in FIG. 5;

FIG. 8 is a plan view of another embodiment of the access circuit portion of the selective access array integrated circuit according to the present invention;

FIG. 9 is a circuit schematic of the select transistors shown in FIG. 8.

DESCRIPTION OF THE PREFERRED EMBODIMENT

Figure 1:
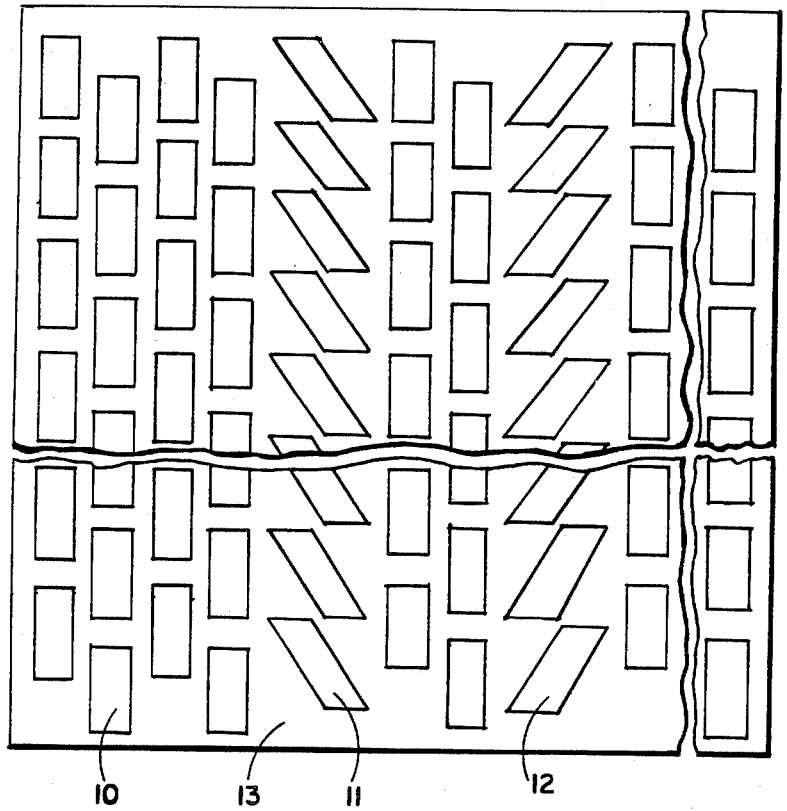
FIG. 1 is a plan view of the electronic device portion of the selective access array integrated circuit illustrating one possible arrangement of an array of impurity doped silicon infrared photoconductors according to the present invention.

FIG. 1 is a top plan view of the electronic device portion of the selective access array circuit implemented on a first major surface of a semiconductor body accordintg to the present invention.

The circuit according to the present invention is implemented on a body of semiconductor material of a first conductivity type. In a preferred embodiment of the present invention, the body of semiconductor material is an n-type wafer, with a patterned layer of n-type semiconductor material formed by implantation of a dopant species on a first flat major surface thereof. On a second opposite and parallel flat major surface of the semiconductor body, a layer of p-type semiconductor material is formed on the body by epitaxial deposition, and a surface layer of n-type semiconductor material is subsequently formed over the p-type layer.

A plurality of electronic devices are implemented on a first major surface of the semiconductor body. The location of such devices are represented in FIG. 1 by the plurality of quadrangles 10, 11 and 12. The devices may vary in size, shape, composition, and function, and the use of rectangles 10 and paralelograms 11 and 12 shown in FIG. 1 are merely illustrative. Such devices may comprise memory or storage cells, radiative cells, photoconductive cells, or other devices. In the example and embodiment we consider here, the regions 10, 11 and 12 form a detection array of photoconductive cells, although the present invention is not intended to be limited to such application.

The geometry of the detector array can be optimized for various system applications. It can consist of a substantial identical square or rectangular detectors arranged in a closely packed two dimensional array. Alternatively, one dimension can be elongated and the columns overlapped. Other orientations are also possible in which selected columns of detectors are placed at angles in a chevron configuration. FIG. 1 illustrates an array containing overlapped columns and a chevron structure. This cell geometry has been chosen to facilitate the tracking of imaged targets as the array is optically scanned. The specific geometry of the detector array can be defined by masking and etching according to techniques known in the art.

The regions defined by the quadrangles 10, 11 and 12 form radiation transmissive but electrically conducting windows. The windows are surrounded by radiation opaque areas 13 which may be formed from a layer of aluminum deposited over an oxide layer on the first major surface of the semiconductor body. This aluminum layer contacts the windows and provides a common electrical contact for the detectors. In a preferred embodiment of the present invention, each transmissive window corresponds to a single discrete photocoductive device formed in the semiconductor body beneath the window.

Figure 2A:
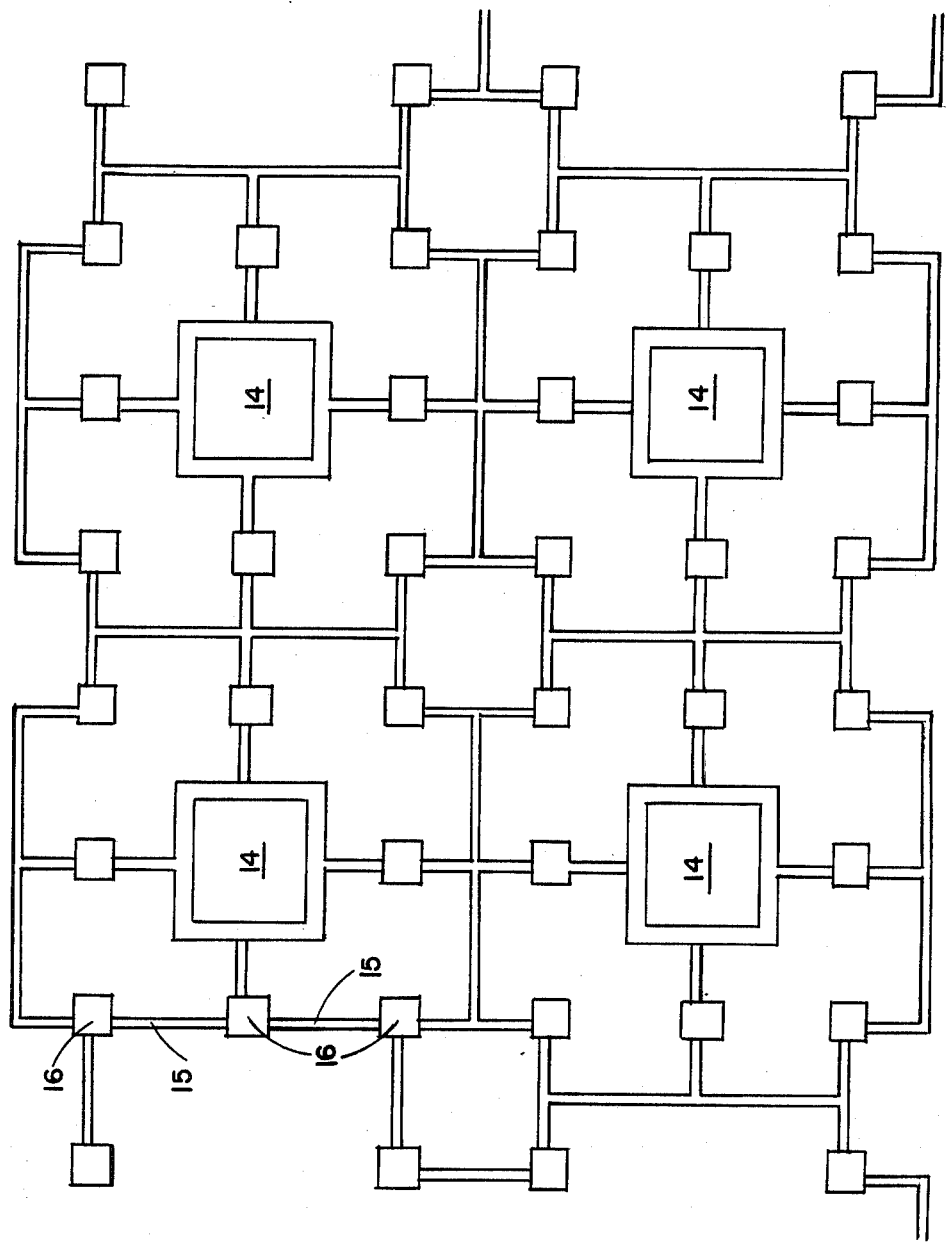
FIG. 2A is a highly enlarged plan view of a first layer of the access circuit portion of the selective access array integrated circuit according to the present invention.

FIG. 2A is a plan view of a portion of the second major surface of the semiconductor wafter through a first plane in the semiconductor body and parallel to the surface on which the selective access array according to the present invention has been implemented. This view shows a portion of the buried contacts 14 of four detectors which have been exposed by preferential etch, and an array of "mini-bus" conducting lines 15 lying between the detectors and MOSFET devices in the first plane. Electrical connection between these lines is afforded by the MOSFET selective access devices 16 which are designated for the purpose of pictoral clarity by small rectangles.

Figure 3:
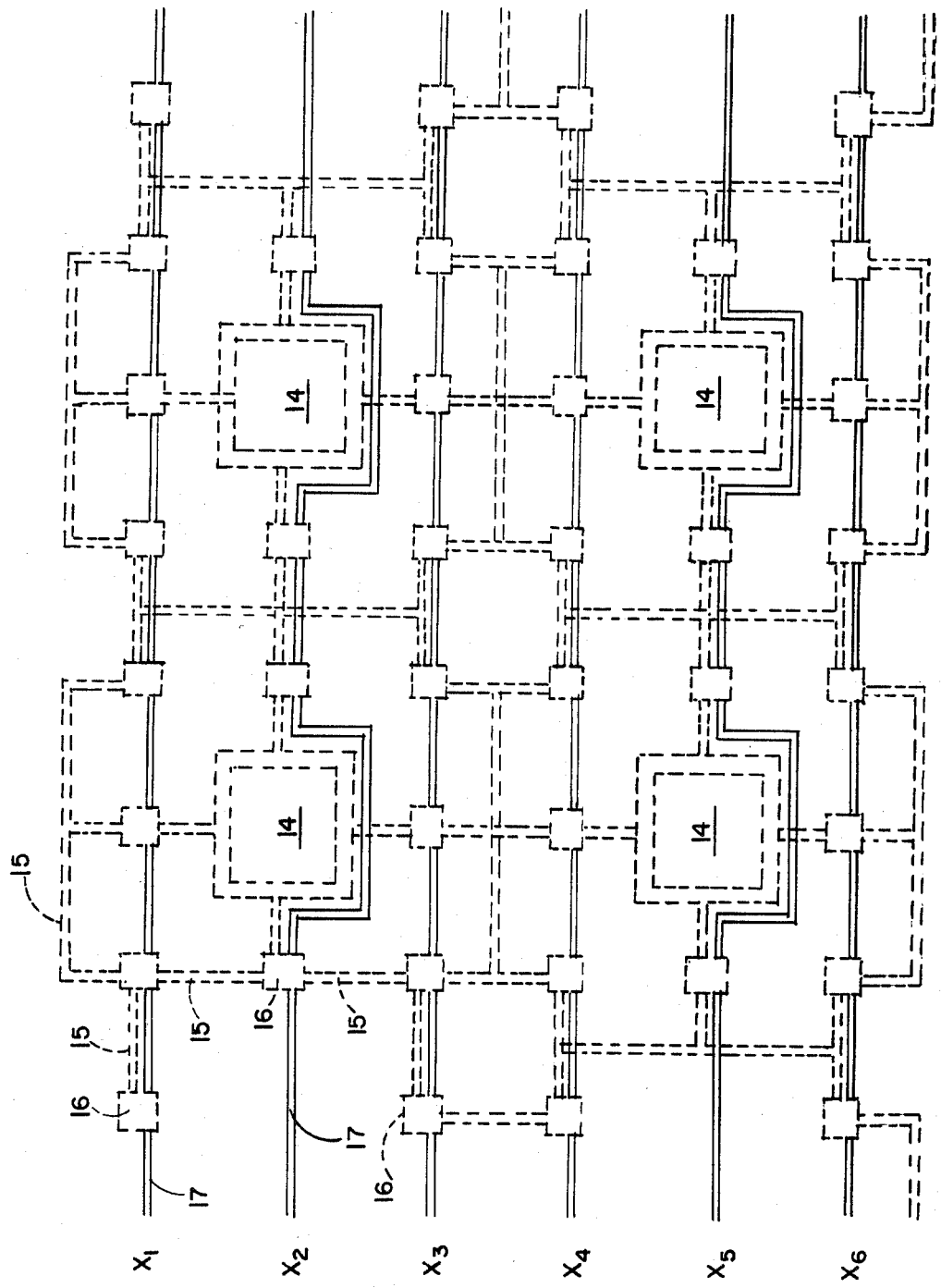
FIG. 3 is a highly enlarged plan view of a second layer of the access circuit portion of the selective access array integrated circuit to the present invention.

FIG. 3 is a plan view of the same portion of the second major surface of the semiconductor wafer as in FIG. 2A through a second plane parallel to the surface at one "higher" level, or closer to the second major surface of the wafer. The figure shows the buried contact 14, the mini-bus conducting line 15, and the rectangles 16 in dotted lines, while the X-address lines 17 in the second plane are shown by solid lines. The X-address lines 17 are implemented one level above the level shown in FIG. 2A and insulated therefrom, except for making electrical contact with a respective contact (not shown) in the access devices 16.

Figure 4:
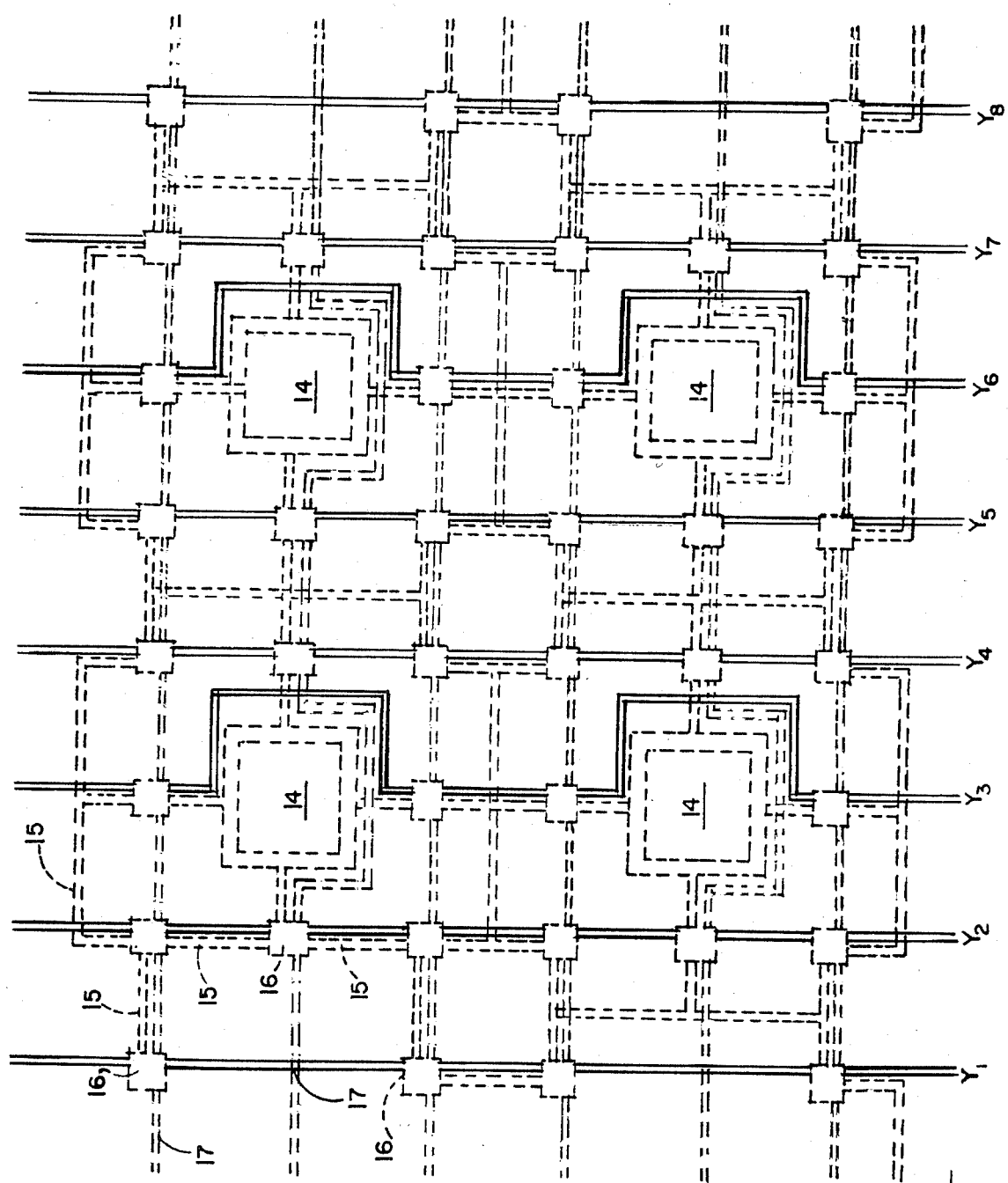
FIG. 4 is a highly enlarged plan view of a third layer of the access circuit portion of the selective access array integrated circuit according to the present invention.

FIG. 4 is a plan view of the same portion of the second major surface of the semiconductor wafer as in FIGS. 2A and 3 through a plane parallel to the surface at one level above that shown in FIG. 3. The figure shows the elements of FIGS. 2A and 3 in dotted lines, while the Y-address lines 18 in the third plane are shown by solid lines. The Y-address lines are implemented one level above the level shown in FIG. 3, and insulated therefrom, except for making electrical contact with a respective contact (not shown) in the access devices 16.

Each of the access devices 16 makes electrical contact with respective X and Y address lines, as is shown in FIGS. 3 and 4. Each of the X and Y addresses are continuous through each device 16, although for simplicity they are shown in segments. They are arranged in rows and columns and are contacted and connected using convention of processing to provide electrical isolation from each other and the substrate.

The access devices 16 constitute switches which connect the mini-bus lines 15 associated therewith together when the X and Y address lines associated with the respective switch are activated.

To create such an electrical connection across the access device 16, a voltage pulse is provided simultaneously on the corresponding X and Y address lines contacting the rectangle 16. In one preferred embodiment of the present invention, the device is kept at cyrogenic temperatures. These temperatures are required to promote sensitive IR detector response. In such an environment, once the X and Y address lines associated with a particular access device 16 are activated, the select switch is turned on, and remains on for a relatively long time.

Figure 2B:
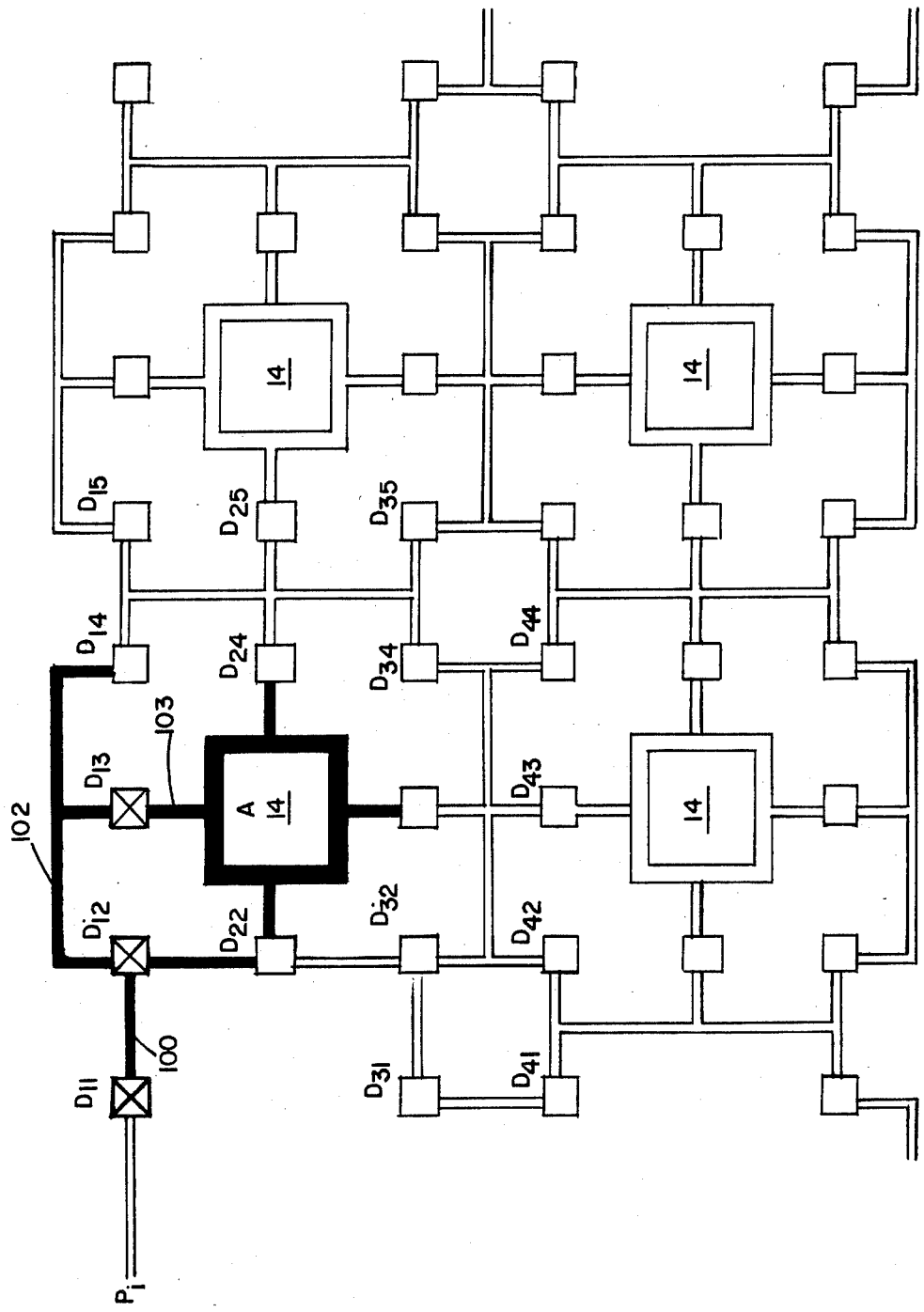
FIG. 2B is a view of FIG. 2A showing how a conducting path is formed between a peripheral contact and a selected element.

It would be worthwhile at this point to discuss a technique for selecting a given detector and creating a path from the selected detector to the periphery of the chip. Suppose it is desired to select detector "A", labeled in FIG. 2B. A path to detector A is formed by generating successive voltages pulses on the following pairs of address lines $X_1 Y_1$; $X_1 Y_2$; $X_1 Y_3$. When $X_1 Y_1$ is activated, the access device $D_{11}$ is turned on. When $X_1 Y_2$ is activated, the access device $D_{12}$ is turned on and when $X_1 Y_3$ is activated, access $D_{13}$ is turned on. An electrically conductive path to "A" is created by mini-bus line from an external contact $P_1$ on the chip periphery to device $D_{11}$, then by mini-bus line 100 to device $D_{12}$ then by mini-bus line 102 to $D_{13}$ and finally by mini-bus line 103 to detector "A".

This process is continued until paths are brought to the other external contacts where separate sensing circuits and amplifiers are available for each detector selected. The paths selected are not unique and considerable redundancy is available in selecting a detector and in routing a path from the selected detector to a selected external contact.

Turning now to FIG. 5, there is shown a plan view of one embodiment of the access circuit portion of the selective access array integrated circuit according to the present invention. An X-address line $X_i$ and a Y-address line $Y_j$ are shown connected to a select transistor shown in a highly simplified manner by the block 19. The current path of the select transistor 19 is also connected to the gate of a second select transistor 20. The main current path of the second select transistor 20 connects the contact 14 of detector A with a mini-bus line 21. Thus when voltage pulses on the select lines $X_y$ and $Y_j$ are provided, the first and second select transistor 19 and 20 are turned on so that the detector A makes electrical contact with the mini-bus line 21. After removal of the voltage pulses, the deposited charge on the gate of transistor 20 is retained for a predetermined period of time so that the detector A is continuously connected to the bus bar line 21 which permits continuous readout from the detector.

Figure 6:
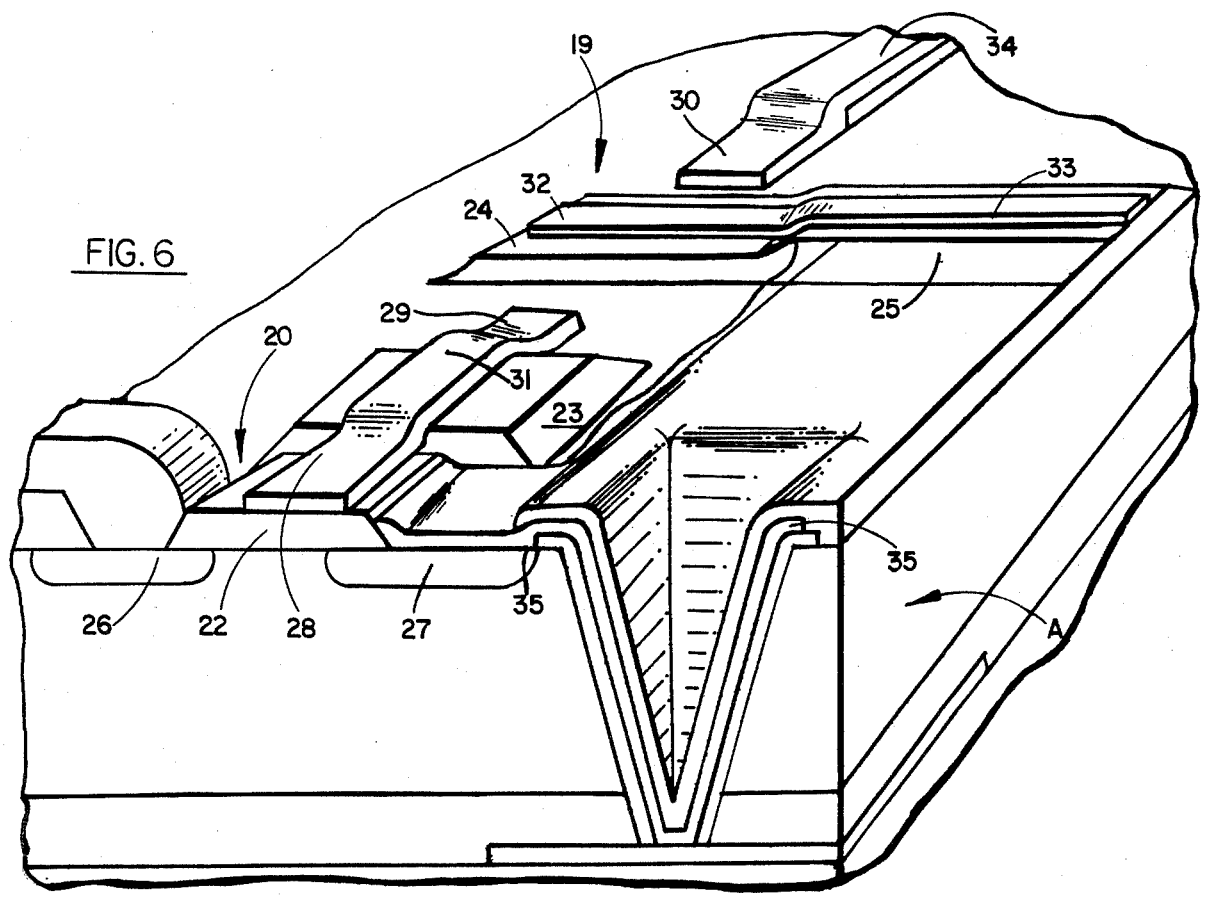
FIG. 6 is a perspective cutaway view of the integrated circuit through the 6—6 line shown in FIG. 5.

FIG. 6 is a perspective cut-away view of the integrated circuit through the 6—6 line shown in FIG. 5. A surface layer of oxide, shown in the Figure as trapezoidal shaped portions, overlies the surface of the semiconductor body. Portions of the oxide layer are specifically designated in the Figure as a gate oxide region 22 associated with field effect transistor 20, a field oxide region 23, another gate oxide region 24 associated with field effect transistor 19, and field oxide region 25.

The diffused regions 26 and 27 of the field effect transistor 20 are also shown, together with gate electrode 28.

Regions 29 and 30 are shown to suggest the locations of the diffused regions of the field effect transistor 19.

FIG. 7 is a cross-sectional view of the semiconductor body through the 7—7 cross-section shown in FIG. 5. The top surface 37 of the semiconductor body consists of opaque areas 38 (also shown in FIG. 1), together with radiation transparent conducting areas 36 which define the sensor area of an electronic device according to the present invention. The opaque areas 38 preferably consist of portions of the first major surface of the semiconductor body which are first covered with a layer 42 of oxide, following an opaque aluminum layer 40 disposed over the oxide layer. The thin layer 40 of aluminum is applied to the surface of the semiconductor body by a process such as sputtering or vacuum deposition as is known in the semiconductor art. The radiation transmissive area 36 consists of a heavily doped impurity layer 41 which is provided on the surface of the semiconductor body by a process of diffusion or ion implantation as is known in the semiconductor art.

The semiconductor body 43 itself, consists of a substrate of semiconductor material such as silicon with an n-type conductivity doped with an n impurity that provides a desired photoconductive spectral response. An n-type impurity is shown in FIG. 7 as an example, although the present invention applies equally well for the device of a substrate with a p-type conductivity. For the n-type substrate, an n-type doped layer 41 with a concentration of $10^{19}$ cm$^{-3}$ is used for the IR transparent conductive layer for each detector.

The second major surface 44 of the semiconductor body includes an n type epitaxial layer 45 on which the semiconductor circuit MOSFET elements are implemented. Layer 45 is isolated from the semiconductor body 43 by a p-type epitaxial layer 46 which is disposed on the surface of the semiconductor body 43.

FIG. 8 is a plan view of another embodiment of the access circuit portion of the selective access array integrated circuit according to the present invention. Since like reference numerals refer to like elements, a detailed description of the Figure is unnecessary.

FIG. 9 is a simplified schematic diagram of the selection circuitry according to the present invention. The circuitry consists of a first field effect transistor having conduction path electrodes one of which electrode is connected to the sensor electrode associated with a sensor element in the semiconductor body and the other electrode being connected with an adjacent mini-bus. The second field effect transistor is also shown having two conduction path electrodes. One of such conduction path electrodes is connected to the gate electrode of the first field effect transistor. The other conduction path electrode of the field effect transistor is connected to the corresponding $Y_j$ input or $Y_j$ address line. The gate electrode of the field effect transistor is connected to the $X_i$ input or $X_i$ address line. The net effect of the operation of the two MOSFETs is that when a pulse is applied simultaneously to the X address line and the Y address line, both MOSFET 19 and 20 turn on, thereby conducting the signal which is on the electrode 26 through the MOSFET 20 to the adjacent mini-bus line where it is transferred. If the X scan is not on, the MOSFET 19 is not conductive and therefore, consequently no voltage is applied to the gate 28 and MOSFET 20 is nonconductive. If no voltage is applied to the Y scan, the MOSFET 20 is nonconductive and therefore no voltage is also applied to the gate 28.

It will be obvious to those skilled in the art that the semiconductor device according to the present invention can be implemented with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A selective access array integrated circuit comprising:

a common body of semiconductor material having a first and a second major surface;

a plurality of electronic devices implemented in a first array on said first major surface, each one of said electronic devices capable of transferring information which changes over a period of time;

a plurality of electronic access elements implemented in a second array, each access element corresponding to at least one of said electronic devices in said first array;

a plurality of signal output pads disposed on the periphery of said second major surface of said body for connection to corresponding respective ones of said electronic devices for simultaneous receiving data from said ones of electronic devices and simultaneously transferring such data externally of said circuit in a non-sequential, parallel data manner, and access means connected to electronic access elements for selectively providing an access signal for continuously and simultaneously accessing predetermined ones of said electronic devices, and forming and maintaining a plurality of electrical readout paths from a selectively determined plurality of ones of said electronic devices to respective ones of said output pads for a predetermined period of time which is independent of any internal operative characteristic of said array circuit.

2. A circuit as defined in claim 1, wherein said access elements are disposed on said second major surface in an array of parallel rows and parallel columns, the rows being disposed perpendicular to the columns, and further comprising conductive bus lines interconnecting said access elements for forming respective ones of said electrical readout path through ones of said access elements which have been activated by said access means from ones of said electronic devices to respective ones of said signal output pads.

3. A circuit as defined in claim 1 wherein said plurality of electronic devices are substantially identical infrared radiation detectors, and each of said electronic access elements comprise a pair of MOS field effect transistors.

4. A circuit as defined in claim 1 wherein said access means comprise X-address select means and Y-address select means which together function to select ones of said electronic access elements.

5. A circuit as defined in claim 4, wherein each electronic access element comprises:
- a first field effect transistor having a first and second conduction path electrodes and a control electrode, said first conduction path electrodes being connected to said Y-address select means, and said control electrode connected to said X-address select means; and
- a second field effect transistor having a first conduction path electrode connected to said electronic device, a second conduction path electrode connected to an output, and a control electrode connected to said second conduction path electrode of said first field effect transistor.

6. A selective access array integrated circuit comprising:
- a common body of semiconductor material having a first and a second major surface;
- a plurality of substantially identical electronic devices implemented in a first array on said first major surface;
- a plurality of electronic access devices implemented in a second array on said second major surface, each access device corresponding to at least one of said electronic devices in said first array;
- a plurality of signal output pads on said body for connection to corresponding respective ones of said electronic devices for simultaneous receiving data from said ones of electronic devices and only transferring such data externally of said circuit in a non-sequential, parallel data manner; and
- access means implemented on said second major surface and connected to electronic access devices for selectively and simultaneously providing access signals to selected ones of said access devices for accessing a predetermined plurality of said electronic devices, and forming and maintaining an plurality of independent, electrically isolated electrical readout paths through groups of selected ones of said access devices, each of said groups forming a single readout path from one of said electronic devices to a respective output pad, said readout path being maintained for a predetermined period of time independent of any internal characteristic of said array circuit so that data is read continuously from each of said predetermined plurality of electronic devices to said respective output pads.

7. A solid state image sensor comprising:
- a common body of semiconductor material having a first and a second major surface;
- a plurality of substantially identical radiation sensitive electronic devices implemented in a first array on said first major surface comprising a layer of aluminum over a surface portion of the first major surface, and a heavily doped impurity layer in window aperture areas of said first major surface where the aluminum layer is absent and said radiation sensitive devices are formed;
- an n-type epitaxial layer implemented on said second major surface including a plurality of electronic access elements implemented in a second array, each element including a pair of MOS field effect transistors, each access element corresponding to at least one of said electronic devices in said first array;
- an identation in said second major surface for permitting an electrode of one of said MOS field effect transistors to make electrical contact with said common body of semiconductor material in a region directly beneath a window aperture of said first major surface and the corresponding radiation sensitive device; and
- access means implemented on said second major surface and connected to said electronic access elements for selectively and simultaneously providing access signals during a first time period for continuously accessing a predetermined plurality of said electronic devices; and for providing access signals during a second subsequent time period for continuously accessing a second predetermined plurality of said electronic devices, an electrical readout path being established and maintained simultaneously from a selectively determined plurality of ones of said electronic devices to corresponding outputs for a period of time determined independently of any characteristic of the sensor.

8. A selective access array integrated circuit comprising:
- a common body of semiconductor material having a first and a second major surface;
- a plurality of electronic devices implemented in a first array on said first major surface, each one of said electronic devices capable of transferring information which changes over a period of time;
- a plurality of electronic access devices implemented in a second array, each access device corresponding to at least one of said electronic devices in said first array;
- a plurality of signal output pads disposed on the periphery of said body for connection to corresponding respective ones of said electronic devices for simultaneous receiving data from said ones of electronic devices and transferring such data externally of said circuit; and
- access means connected to electronic access devices for selectively providing an access signal for continuously and simultaneously accessing predetermined ones of said electronic devices, and forming and maintaining an electrical readout path a selectively determined plurality of ones of said electronic devices to corresponding output pads for a predetermined period of time independent of any internal operative characteristic of said array circuit, said access means comprises X-address select lines, and Y-address select lines, an X-address and a Y-address line together functioning to activate ones of said electronic access devices, and bus means for providing continuous and simultaneous access to said predetermined ones of said electronic devices;

characterized in that said electronic access devices comprise a first field effect transistor having first and second conduction path electrodes and a control electrode; said first conduction path electrode being connected to said Y-address select lines, and said control electrode connected to said X-address select lines; and a second field effect transistor having a first conduction path electrode connected to said electronic device, a second conduction path electrode connected to an output line extending across said second major surface to the periphery of said second major surface, and a control electrode connected to said second conduction path electrode of said first field effect transistor, said output line connected to one of said signal output pads, such that when one of said Y-address select lines and one of said X-address select lines is activated, said first and said second transistors are turned on, and information from said corresponding electronic device being transferred continuously through said second field effect transistor to said respective signal output pad.

9. A selective access solid state sensor array integrated circuit comprising:

a common body of semiconductor material having a first and a second major surface;

a plurality of substantially identical electronic sensor devices implemented in a first array on said first major surface;

a plurality of electronic access devices implemented in a second array on said second major surface, each access device corresponding to at least one of said electronic sensor devices in said first array;

a plurality of signal output pads on said second major surface of said body for connection to corresponding respective ones of said electronic sensor devices for simultaneous receiving data from said ones of electronic sensor devices and transferring such data externally of said circuit in a non-sequential, parallel data manner, and access means implemented on said second major surface and connected to electronic access devices for selectively and simultaneously providing access signals for accessing a predetermined plurality of said electronic sensor devices, which, when operable at cryogenic temperatures, form and maintain a plurality of continuous electrical readout paths from a selectively determined plurality of ones of said electronic sensor devices to corresponding respective ones of said output pads for a predetermined period of time which is independent of any internal characteristic of said array circuit.

* * * * *